United States Patent
Tsai et al.

(10) Patent No.: US 9,831,687 B2
(45) Date of Patent: Nov. 28, 2017

(54) SUPPLYING-END MODULE FOR INDUCTION-TYPE POWER SUPPLY SYSTEM AND SIGNAL ANALYSIS CIRCUIT THEREIN

(71) Applicant: Fu Da Tong Technology Co., Ltd., New Taipei (TW)

(72) Inventors: Ming-Chiu Tsai, New Taipei (TW); Chi-Che Chan, New Taipei (TW)

(73) Assignee: Fu Da Tong Technology Co., Ltd., New Taipei (TW)

( * ) Notice: Subject to any disclaimer, the term of this patent is extended or adjusted under 35 U.S.C. 154(b) by 289 days.

(21) Appl. No.: 14/876,788

(22) Filed: Oct. 6, 2015

(65) Prior Publication Data

US 2016/0028247 A1  Jan. 28, 2016

Related U.S. Application Data

(63) Continuation-in-part of application No. 14/017,321, filed on Sep. 4, 2013, now Pat. No. 9,628,147, which
(Continued)

(30) Foreign Application Priority Data

| Feb. 1, 2011 | (TW) | 100103836 A |
| May 3, 2013 | (TW) | 102115983 A |
| Jun. 30, 2015 | (TW) | 104121025 A |

(51) Int. Cl.
*H01F 27/42* (2006.01)
*H01F 38/00* (2006.01)
(Continued)

(52) U.S. Cl.
CPC ............... *H02J 5/005* (2013.01); *G06F 1/26* (2013.01); *G06F 1/266* (2013.01); *H03F 3/04* (2013.01);
(Continued)

(58) Field of Classification Search
USPC ........................................................ 307/104
See application file for complete search history.

(56) References Cited

U.S. PATENT DOCUMENTS

| 4,393,516 A | 7/1983 | Itani |
| 4,561,443 A | 12/1985 | Hogrefe |
(Continued)

FOREIGN PATENT DOCUMENTS

| CN | 1142649 A | 2/1997 |
| CN | 1930790 A | 3/2007 |
(Continued)

*Primary Examiner* — Rexford Barnie
*Assistant Examiner* — Dru Parries
(74) *Attorney, Agent, or Firm* — Winston Hsu

(57) ABSTRACT

A signal analysis circuit for a supplying-end module includes a first voltage divider circuit, for attenuating a coil signal of a supplying-end coil; a first amplifier circuit, for obtaining parts of the attenuated coil signal higher than a reference voltage to output a half-wave signal; a first envelope detector, for performing envelope extraction on the half-wave signal to obtain a DC signal; a second voltage divider circuit, for attenuating the half-wave signal; a second amplifier circuit, for obtaining parts of the attenuated half-wave signal higher than the DC signal to output an amplified half-wave signal; a second envelope detector, for performing envelope extraction on the amplified half-wave signal to generate an envelope signal; a coupling capacitor, for filtering out the DC component of the envelope signal; a third voltage divider circuit, for combining the AC component of the envelope signal with a DC voltage to retrieve a trigger signal.

31 Claims, 8 Drawing Sheets

Related U.S. Application Data is a continuation-in-part of application No. 13/541,090, filed on Jul. 3, 2012, now Pat. No. 9,075,587, and a continuation-in-part of application No. 13/212,564, filed on Aug. 18, 2011, now Pat. No. 8,941,267, which is a continuation-in-part of application No. 13/154,965, filed on Jun. 7, 2011, now Pat. No. 8,810,072.

(51) Int. Cl.
| | |
|---|---|
| H02J 5/00 | (2016.01) |
| H03F 3/04 | (2006.01) |
| G06F 1/26 | (2006.01) |
| H04B 5/00 | (2006.01) |
| H02M 3/335 | (2006.01) |
| H02J 50/12 | (2016.01) |
| H02J 50/80 | (2016.01) |

(52) U.S. Cl.
CPC ............ *H04B 5/0037* (2013.01); *H02J 50/12* (2016.02); *H02J 50/80* (2016.02); *H02M 3/33576* (2013.01); *H03F 2200/102* (2013.01); *H04B 5/0031* (2013.01); *Y02B 70/1433* (2013.01)

(56) References Cited

U.S. PATENT DOCUMENTS

| | | | |
|---|---|---|---|
| 5,270,998 | A | 12/1993 | Uchiumi |
| 5,734,254 | A | 3/1998 | Stephens |
| 5,987,244 | A | 11/1999 | Kau |
| 6,122,329 | A | 9/2000 | Zai |
| 6,154,375 | A | 11/2000 | Majid |
| 6,184,651 | B1 | 2/2001 | Fernandez |
| 6,345,203 | B1 | 2/2002 | Mueller |
| 7,336,929 | B2 | 2/2008 | Yasuda |
| 7,720,452 | B2 | 5/2010 | Miyahara |
| 7,791,311 | B2 | 9/2010 | Sagoo |
| 7,847,438 | B2 | 12/2010 | Jin |
| 8,004,235 | B2 | 8/2011 | Baarman |
| 8,041,974 | B2 | 10/2011 | Lin |
| 8,072,310 | B1 | 12/2011 | Everhart |
| 8,098,043 | B2 | 1/2012 | Lin |
| 8,183,827 | B2 | 5/2012 | Lyon |
| 8,188,619 | B2 | 5/2012 | Azancot |
| 8,217,535 | B2 | 7/2012 | Uchida et al. |
| 8,217,621 | B2 | 7/2012 | Tsai et al. |
| 8,248,024 | B2 | 8/2012 | Yuan et al. |
| 8,358,103 | B2 | 1/2013 | Eastlack |
| 8,373,387 | B2 | 2/2013 | Bourilkov et al. |
| 8,412,963 | B2 | 4/2013 | Tsai et al. |
| 8,417,359 | B2 | 4/2013 | Tsai et al. |
| 8,541,975 | B2 | 9/2013 | Park et al. |
| 8,772,979 | B2 | 7/2014 | Tsai |
| 8,810,072 | B2 | 8/2014 | Tsai |
| 9,048,881 | B2 | 6/2015 | Tsai |
| 9,075,587 | B2 | 7/2015 | Tsai |
| 2006/0017550 | A1 | 1/2006 | Yoshida |
| 2007/0177533 | A1 | 8/2007 | Palay |
| 2008/0079392 | A1 | 4/2008 | Baarman |
| 2008/0231120 | A1 | 9/2008 | Jin |
| 2009/0009006 | A1 | 1/2009 | Jin |
| 2009/0026844 | A1 | 1/2009 | Iisaka |
| 2009/0033294 | A1 | 2/2009 | Odajima |
| 2009/0174263 | A1 | 7/2009 | Baarman |
| 2009/0267561 | A1 | 10/2009 | Lin |
| 2009/0271048 | A1 | 10/2009 | Wakamatsu |
| 2009/0284082 | A1 | 11/2009 | Mohammadian |
| 2009/0302800 | A1 | 12/2009 | Shiozaki |
| 2009/0322280 | A1 | 12/2009 | Kamijo |
| 2010/0007307 | A1 | 1/2010 | Baarman |
| 2010/0270867 | A1 | 10/2010 | Abe |
| 2010/0277003 | A1 | 11/2010 | Von Novak et al. |
| 2010/0279606 | A1 | 11/2010 | Hillan |
| 2011/0136550 | A1 | 6/2011 | Maugars |
| 2011/0158329 | A1 | 6/2011 | Oettinger |
| 2011/0159812 | A1 | 6/2011 | Kim |
| 2011/0176589 | A1 | 7/2011 | Kolof |
| 2011/0196544 | A1 | 8/2011 | Baarman |
| 2011/0204723 | A1 | 8/2011 | Irish |
| 2011/0264945 | A1 | 10/2011 | Tsai |
| 2011/0278949 | A1 | 11/2011 | Tsai |
| 2011/0285212 | A1 | 11/2011 | Higuma |
| 2011/0299636 | A1 | 12/2011 | Tsai |
| 2012/0025622 | A1 | 2/2012 | Kim |
| 2012/0272076 | A1 | 10/2012 | Tsai |
| 2012/0293009 | A1 | 11/2012 | Kim |
| 2012/0328061 | A1 | 12/2012 | Chow |
| 2013/0015705 | A1 | 1/2013 | Abe |
| 2013/0162204 | A1 | 6/2013 | Jung |
| 2013/0175873 | A1 | 7/2013 | Kwon |
| 2013/0176023 | A1 | 7/2013 | Komiyama |
| 2013/0234532 | A1 | 9/2013 | Fells |
| 2014/0024919 | A1 | 1/2014 | Metzenthen |
| 2014/0084857 | A1 | 3/2014 | Liu |
| 2014/0152251 | A1 | 6/2014 | Kim |
| 2015/0008756 | A1 | 1/2015 | Lee |
| 2015/0028875 | A1 | 1/2015 | Irie |
| 2015/0054355 | A1 | 2/2015 | Ben-Shalom |

FOREIGN PATENT DOCUMENTS

| | | |
|---|---|---|
| CN | 101252293 A | 8/2008 |
| CN | 101834473 A | 9/2010 |
| CN | 101978571 A | 2/2011 |
| CN | 101272063 B | 1/2012 |
| CN | 102315692 A | 1/2012 |
| CN | 102710409 A | 10/2012 |
| CN | 102804619 A | 11/2012 |
| CN | 102904475 A | 1/2013 |
| CN | 103248130 A | 8/2013 |
| CN | 103424133 A | 12/2013 |
| CN | 103425169 A | 12/2013 |
| CN | 103595144 A | 2/2014 |
| CN | 103975497 A | 8/2014 |
| CN | 105449875 A | 3/2016 |
| EP | 2608419 A2 | 6/2013 |
| EP | 2 793 355 A1 | 10/2014 |
| JP | 200660909 A | 3/2006 |
| JP | 2008206305 A | 9/2008 |
| JP | 2010213414 A | 9/2010 |
| JP | 2013135518 A | 7/2013 |
| TW | M246884 | 10/2004 |
| TW | 200527302 | 8/2005 |
| TW | 201018042 | 5/2010 |
| TW | 201034334 A1 | 9/2010 |
| TW | 201123673 | 7/2011 |
| TW | 201123676 | 7/2011 |
| TW | 201128972 | 8/2011 |
| TW | 201138258 | 11/2011 |
| TW | 201234871 | 8/2012 |
| TW | 201243281 | 11/2012 |
| TW | 201251389 | 12/2012 |
| TW | I389416 | 3/2013 |
| TW | 201315082 | 4/2013 |
| TW | I408861 | 9/2013 |
| TW | 201412047 | 3/2014 |
| TW | 201414130 | 4/2014 |
| TW | 201415752 | 4/2014 |
| TW | 201417445 | 5/2014 |
| TW | 201440368 A | 10/2014 |
| TW | I459676 B | 11/2014 |
| TW | I472897 | 2/2015 |
| TW | I483509 B | 5/2015 |
| WO | 2009149464 A2 | 12/2009 |
| WO | 2013043974 A2 | 3/2013 |

SUPPLYING-END MODULE FOR INDUCTION-TYPE POWER SUPPLY SYSTEM AND SIGNAL ANALYSIS CIRCUIT THEREIN

CROSS REFERENCE TO RELATED APPLICATIONS

This application is a continuation-in-part of U.S. application Ser. No. 14/017,321, filed on Sep. 4, 2013 and entitled "METHOD OF AUTOMATICALLY ADJUSTING DETERMINATION VOLTAGE AND VOLTAGE ADJUSTING DEVICE THEREOF", which is a continuation-in-part of U.S. application Ser. No. 13/212,564, filed on Aug. 18, 2011 and entitled "High-power induction-type power supply system and its bi-phase decoding method" and a continuation-in-part of U.S. application Ser. No. 13/541,090, filed on Jul. 3, 2012 and entitled "Induction type power supply system with synchronous rectification control for data transmission". U.S. application Ser. No. 13/212,564 is further a continuation-in-part of U.S. application Ser. No. 13/154,965, filed on Jun. 7, 2011 and entitled "High-power induction-type power supply system and its data transmission method".

BACKGROUND OF THE INVENTION

1. Field of the Invention

The present invention relates to a signal analysis circuit for a supplying-end module of an induction type power supply system, and more particularly, to a signal analysis circuit capable of analyzing a coil signal to retrieve a trigger signal in a supplying-end module of an induction type power supply system.

2. Description of the Prior Art

For safety purposes, a power supply device of an induction type power supply system has to ensure that a proper power receiving device is positioned on the sensing area of a supplying-end coil of the power supply device, and that the power receiving device is ready to receive power before the power is supplied. In order to allow the power supply device to confirm the above conditions, a data code should be transmitted for identification purposes. The data code transmission is performed via the following steps: the power supply device drives the supplying-end coil to generate resonance and sends electromagnetic power to the power receiving device in order to transmit power. When the power receiving device receives the power, the power receiving device may change the impedance on the receiving-end coil via the signal modulation technology, and the variations are fed back to vary the amplitude of carriers on the supplying-end coil. The signals of the supplying-end coil are then converted into digital information to be transmitted to a supplying-end microprocessor for interpretation via a circuit.

The signal variations fed back to the supplying-end coil via the abovementioned modulation technology are demodulated by a signal analysis circuit in the supplying-end module. Since the coil signal is an alternating circuit (AC) signal with a larger voltage such as several tens or hundreds of volts while the modulation signal is an amplitude variation on the AC signal and is far smaller than the amplitude of the coil signal, the AC coil signal cannot be directly processed by the processor and should be converted to be within a voltage range via the signal analysis circuit, where the voltage range is able to be processed by the processor. In U.S. Publication No. 2013/0342027 A1, the signal analysis circuit includes a clamping circuit in its front end. The clamping circuit clamps the signal to a higher voltage, and the signal analysis circuit then performs rectification and low-pass filtering on the signal to generate a signal interpretable by the processor.

The above circuit structure in the prior art still has some drawbacks, however. Please refer to FIG. 1, which is a waveform diagram of a supplying-end coil of an induction type power supply system. As shown in FIG. 1, waveforms W1_1 and W1_2 are driving signals on both terminals of the supplying-end coil received from a driving circuit, respectively, where the waveforms W1_1 and W1_2 are rectangular waves and inverse to each other. A waveform W1_3 is a voltage signal on the coil. Ideally, the coil signal should be a sine wave continuously oscillating. As shown by the waveform W1_3, however, the coil signal appears to be an ideal sine wave in the positive half cycle and negative half cycle, but a voltage discontinuity appears when the waveforms W1_1 and W1_2 of the driving signals are switched (i.e., the boundary between the positive half cycle and the negative half cycle). The voltage difference of the voltage discontinuity is substantially equal to the amplitude of the driving signals. Note that the coil sends the power by oscillating, but the occurrence of voltage discontinuity cannot generate oscillation to deliver power. This decreases the power emission capability of the coil. In other words, the coil signal includes two parts: one is a sine-wave signal generated by coil resonance and the other is composed of the voltage discontinuity in the driving signals. However, the processor cannot interpret the effective sine wave component in the coil signal; hence, the processor may wrongly determine that the oscillation voltage on the coil is too high during power adjustment, and thus perform erroneous adjustment. In addition, when the driving voltage increases, the ratio of the sine wave signal in the coil signal may be reduced; this increases the difficulty of interpreting the modulation signal.

In U.S. Publication No. 2013/0342027 A1, the high-voltage signal from the coil may be outputted to the clamping circuit first. This signal, which directly enters the diode of the clamping circuit without being attenuated, may damage the diode due to an over-high voltage. In its signal analysis circuit, the front-end stages are operated in higher voltages and the operating voltage is reduced gradually toward the back-end stages. When a circuit element inside the signal analysis circuit is damaged, an unexpected high voltage may enter the supplying-end processor and damage it. If the supplying-end processor is burnt out, the safety control of the power supply system may malfunction. On the other hand, the signal analysis circuit in the prior art does not have signal amplification capability. In order to obtain a larger signal variation, the attenuation ratio of the coil signal should be as reduced as possible. In such a condition, the circuit elements need to endure a higher voltage, and thus are easily burnt or have decreased life. Furthermore, since the signal analysis circuit has only the signal attenuation capability but cannot perform amplification on signals, tiny signal variations are hard to be interpreted.

Thus, there is a need to provide a new signal analysis circuit, in order to obtain a better signal analysis performance and also prevent the above problems.

SUMMARY OF THE INVENTION

It is therefore an objective of the present invention to provide a signal analysis circuit capable of retrieving the trigger signal for a supplying-end module of an induction type power supply system.

The present invention discloses a signal analysis circuit for a supplying-end module of an induction type power supply system. The signal analysis circuit is used for analyzing a coil signal on a supplying-end coil of the supplying-end module, to retrieve a trigger signal. The signal analysis circuit comprises a first voltage divider circuit, a first amplifier circuit, a first envelope detector circuit, a second voltage divider circuit, a second amplifier circuit, a second envelope detector circuit, a coupling capacitor and a third voltage divider circuit. The first voltage divider circuit, coupled to the supplying-end coil, is used for attenuating the coil signal to generate an attenuated coil signal. The first amplifier circuit, coupled to the first voltage divider circuit, is used for obtaining parts of the attenuated coil signal higher than a reference voltage to output a half-wave signal. The first envelope detector circuit, coupled to the first amplifier circuit, is used for performing envelope extraction on the half-wave signal to obtain a direct current (DC) signal and outputting the DC signal. The second voltage divider circuit, coupled to the first amplifier circuit, is used for attenuating the half-wave signal to generate an attenuated half-wave signal. The second amplifier circuit, coupled to the first envelope detector circuit and the second voltage divider circuit, is used for obtaining parts of the attenuated half-wave signal higher than the DC signal to output an amplified half-wave signal. The second envelope detector circuit, coupled to the second amplifier circuit, is used for performing envelope extraction on the amplified half-wave signal to generate an envelope signal and outputting the envelope signal. The coupling capacitor, coupled to the second envelope detector circuit, is used for performing filtering on the envelope signal to filter out a DC component of the envelope signal and outputting an alternating current (AC) component of the envelope signal. The third voltage divider circuit, coupled to the coupling capacitor, is used for generating a DC voltage which is combined with the AC component of the envelope signal to output the trigger signal.

The present invention further discloses a supplying-end module for an induction type power supply system. The supplying-end module comprises a supplying-end coil, a resonant capacitor, at least one power driver unit, an external voltage source, a power supplying unit, a signal analysis circuit and a processor. The resonant capacitor, coupled to the supplying-end coil, is used for performing resonance together with the supplying-end coil. The at least one power driver unit, coupled to the supplying-end coil and the resonant capacitor, is used for driving the supplying-end coil to generate power. The external voltage source is used for outputting a first power. The power supplying unit, coupled to the external voltage source, is used for receiving the first power to generate a second power. The signal analysis circuit, coupled to the supplying-end coil, is used for analyzing a coil signal on the supplying-end coil to retrieve a trigger signal. The processor, coupled to the signal analysis circuit, is used for receiving the trigger signal and decoding the trigger signal to obtain a modulation data. The signal analysis circuit comprises a first voltage divider circuit, a first amplifier circuit, a first envelope detector circuit, a second voltage divider circuit, a second amplifier circuit, a second envelope detector circuit, a coupling capacitor and a third voltage divider circuit. The first voltage divider circuit, coupled to the supplying-end coil, is used for attenuating the coil signal on the supplying-end coil to generate an attenuated coil signal. The first amplifier circuit, coupled to the first voltage divider circuit, is used for obtaining parts of the attenuated coil signal higher than a reference voltage to output a half-wave signal. The first envelope detector circuit, coupled to the first amplifier circuit, is used for performing envelope extraction on the half-wave signal to obtain a DC signal and outputting the DC signal. The second voltage divider circuit, coupled to the first amplifier circuit, is used for attenuating the half-wave signal to generate an attenuated half-wave signal. The second amplifier circuit, coupled to the first envelope detector circuit and the second voltage divider circuit, is used for obtaining parts of the attenuated half-wave signal higher than the DC signal to output an amplified half-wave signal. The second envelope detector circuit, coupled to the second amplifier circuit, is used for performing envelope extraction on the amplified half-wave signal to generate an envelope signal and outputting the envelope signal. The coupling capacitor, coupled to the second envelope detector circuit, is used for performing filtering on the envelope signal to filter out a DC component of the envelope signal and outputting an AC component of the envelope signal. The third voltage divider circuit, coupled to the coupling capacitor, is used for generating a DC voltage which is combined with the AC component of the envelope signal to output the trigger signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
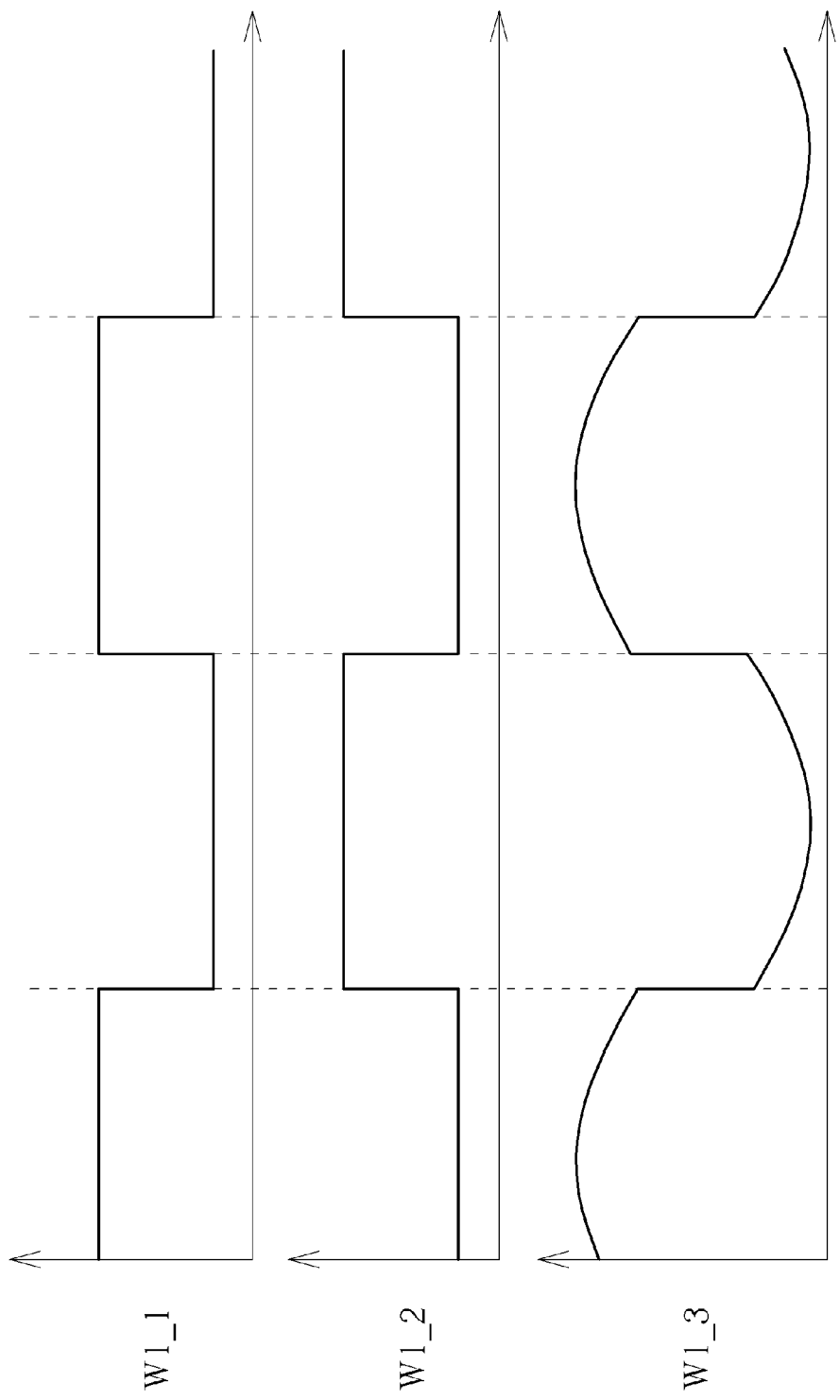
FIG. 1 is a waveform diagram of a supplying-end coil of an induction type power supply system.
Figure 2:
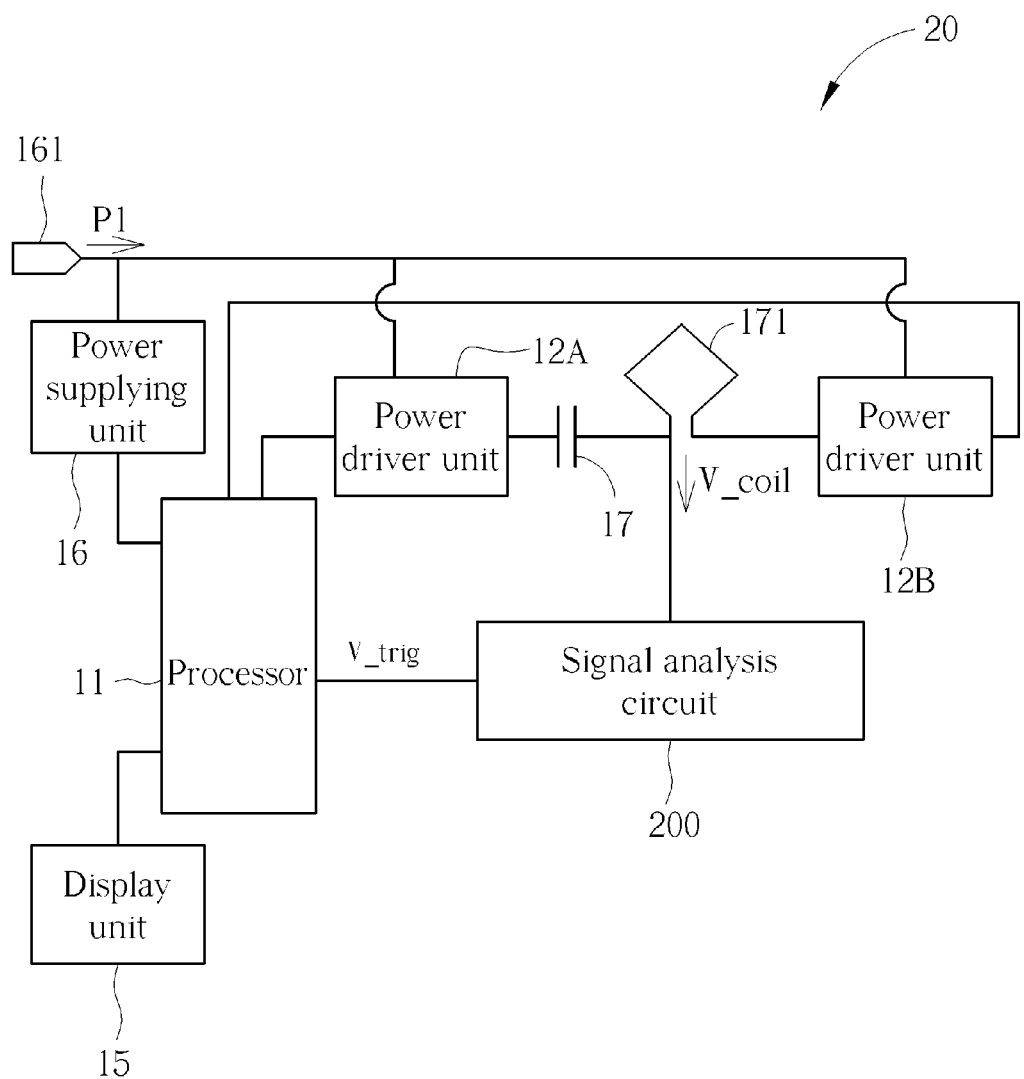
FIG. 2 is a schematic diagram of a supplying-end module according to an embodiment of the present invention.

Please refer to FIG. 2, which is a schematic diagram of a supplying-end module 20 according to an embodiment of the present invention. The supplying-end module 20, which is used for an induction type power supply system, includes a supplying-end coil 171, a resonant capacitor 17, power driver units 12A and 12B, an external voltage source 161, a power supplying unit 16, a signal analysis circuit 200, a processor 11 and a display unit 15. The supplying-end coil 171 is used for sending power to the power receiving device and receiving feedback signals from the power receiving device. The supplying-end coil 171 then transmits the feedback signals to the signal analysis circuit 200 to be analyzed and processed. The resonant capacitor 17, coupled to the supplying-end coil 171, is used for performing resonance together with the supplying-end coil 171. The power driver units 12A and 12B is coupled to the supplying-end coil 171 and the resonant capacitor 17 and controlled by the processor 11, for driving the supplying-end coil 171 to generate power to be sent. When the power driver units 12A and 12B are both active, full-bridge driving is performed. In one embodiment, only one of the power driver units 12A and 12B may be active, or only one of the power driver units 12A or 12B is disposed, which leads to half-bridge driving. The external voltage source 161 may output power P1. The power supplying unit 16, coupled to the external voltage source 161, may receive the power P1 to generate power P2. The signal analysis circuit 200 is used for analyzing a coil signal V_coil on the supplying-end coil 171 to retrieve a trigger signal V_trig. The processor 11, coupled to the signal analysis circuit 200, is used for receiving the trigger signal V_trig and decoding the trigger signal V_trig to obtain a modulation data. The processor 11 may be a microprocessor, a micro controller unit (MCU) or any other type of processing device. The display unit 15, coupled to the processor 11, is used for displaying an operational status of the supplying-end module 20.

In contrast to the supplying-end module of the induction type power supply system in the prior art, the present invention improves the structure of the signal analysis circuit. According to the embodiments of the present invention, a voltage divider circuit is applied in the front end of the signal analysis circuit for attenuating the coil voltage, so that the signal analysis circuit may be operated under a lower voltage. This reduces the usage of circuit elements with high withstanding voltage, to reduce the area occupied by the elements and also prevent the high voltage from damaging the circuit. In addition, the signal analysis circuit of the present invention includes amplifier circuits for amplifying the trigger signals to be analyzed, in order to increase the signal interpretation capability.

Figure 3:
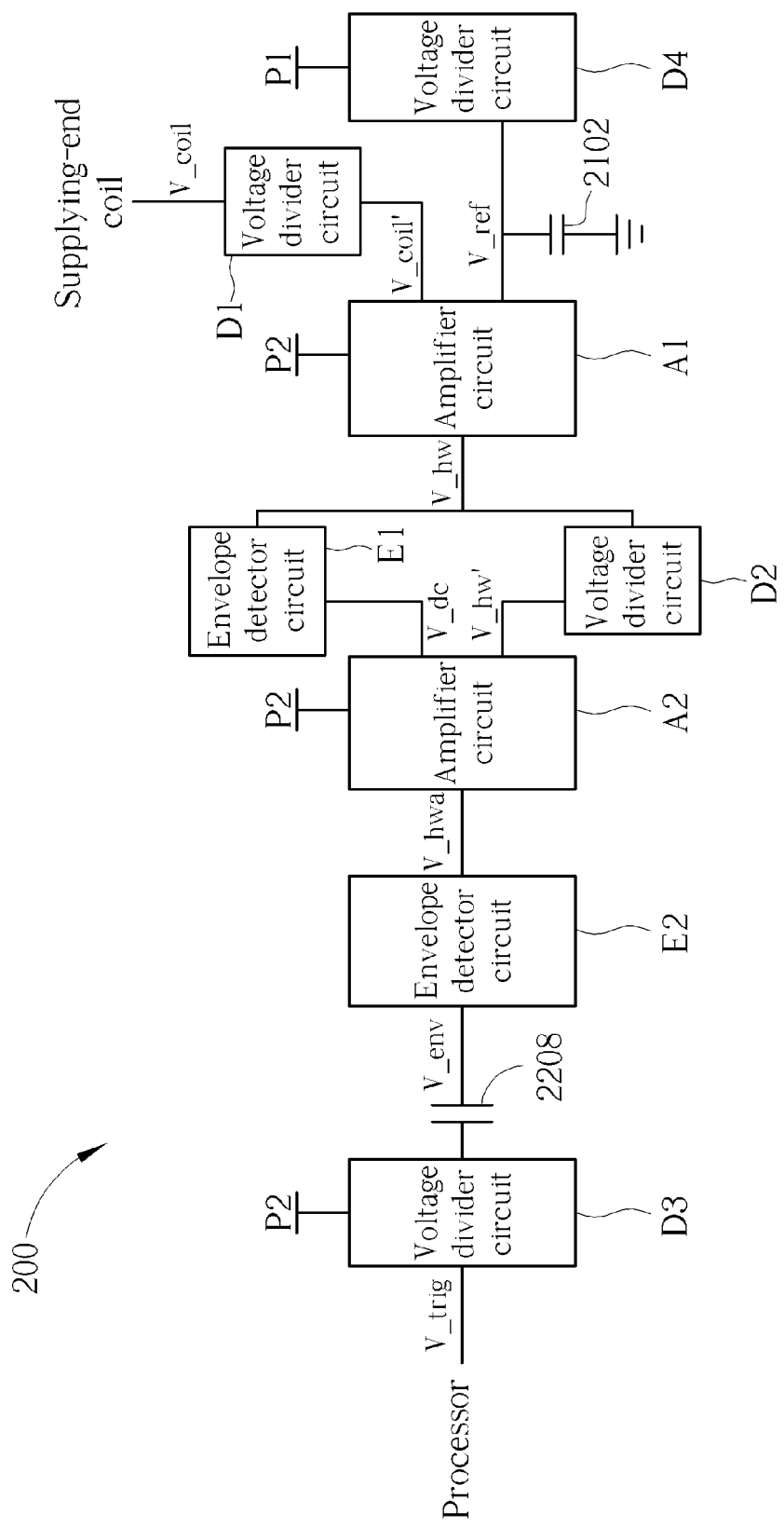
FIG. 3 is a schematic diagram of an implementation of the signal analysis circuit.

In an embodiment, the signal analysis circuit 200 shown in FIG. 2 may include two amplifier circuits, which perform two-stage amplification to enhance the magnitude of the trigger signal V_trig, allowing the trigger signal V_trig to be interpreted more easily. Please refer to FIG. 3, which is a schematic diagram of an implementation of the signal analysis circuit 200. As shown in FIG. 3, the signal analysis circuit 200 includes voltage divider circuits D1-D4, amplifier circuits A1-A2, envelope detector circuits E1-E2, a coupling capacitor 2208 and a voltage regulator capacitor 2102. The voltage divider circuit D1, coupled to the supplying-end coil 171, is used for attenuating the coil signal V_coil to generate an attenuated coil signal V_coil'. The amplifier circuit A1, coupled to the voltage divider circuit D1, is used for obtaining parts of the attenuated coil signal V_coil' higher than a reference voltage V_ref, to generate and output a half-wave signal V_hw to the envelope detector circuit E1 and the voltage divider circuit D2. The envelope detector circuit E1, coupled to the amplifier circuit A1, is used for performing envelope extraction on the half-wave signal V_hw to generate a DC signal V_dc and outputting the DC signal V_dc. The voltage divider circuit D2, coupled to the amplifier circuit A1, is used for attenuating the half-wave signal V_hw to generate an attenuated half-wave signal V_hw'. The amplifier circuit A2, coupled to the envelope detector circuit E1 and the voltage divider circuit D2, is used for obtaining parts of the attenuated half-wave signal V_hw' higher than the DC signal V_dc to output an amplified half-wave signal V_hwa to the envelope detector circuit E2. The envelope detector circuit E2, coupled to the amplifier circuit A2, is used for performing envelope extraction on the amplified half-wave signal V_hwa to generate an envelope signal V_env and outputting the envelope signal V_env. The coupling capacitor 2208, coupled to the envelope detector circuit E2, is used for performing filtering on the envelope signal V_env to filter out a DC component of the envelope signal V_env and outputting an alternating circuit (AC) component of the envelope signal V_env. The voltage divider circuit D3, coupled to the coupling capacitor 2208, is used for generating a DC voltage. The DC voltage is combined with the AC component of the envelope signal V_env to generate and output the trigger signal V_trig. The voltage divider circuit D4, coupled to the amplifier circuit A1, is used for generating the reference voltage V_ref and outputting the reference voltage V_ref to the amplifier circuit A1. The voltage regulator capacitor 2102, coupled to the voltage divider circuit D4, is used for stabilizing the reference voltage V_ref.

In detail, the coil signal V_coil may first encounter the voltage divider circuit D1 when entering the signal analysis circuit 200. The voltage divider circuit D1 may attenuate the coil signal V_coil to generate the attenuated coil signal V_coil'. In general, the attenuation ratio may be 50, 100 or other number. The attenuation of the voltage divider circuit D1 aims at allowing the coil signal V_coil to be attenuated to a lower voltage before the coil signal V_coil enters back-end circuit elements in the signal analysis circuit 200 and the processor 11, so that the coil signal V_coil may be processed under an operational voltage range tolerable by the back-end circuit elements and the processor 11. On the other hand, the voltage divider circuit D4 may receive the power P1 from the external voltage source 161 and attenuate the power P1 to generate the reference voltage V_ref. The amplifier circuit A1 may receive the attenuated coil signal V_coil' and the reference voltage V_ref and output parts of the attenuated coil signal V_coil' higher than the reference voltage V_ref as the half-wave signal V_hw. Preferably, the voltage divider circuits D1 and D4 may apply adequate attenuation ratios, so that the half-wave signal V_hw outputted by the amplifier circuit A1 may include the sine wave generated by oscillation of the supplying-end coil 171 and exclude the voltage discontinuity generated when the rectangular waves of the driving signals are switched. This prevents erroneous determination of power adjustment due to the voltage discontinuity, as occurred in the prior art. For example, in an embodiment, the attenuation ratio of the voltage divider circuit D4 attenuating the power P1 to generate the reference voltage V_ref may be configured to be equal to the ratio of the voltage divider circuit D1 attenuating the coil signal V_coil. Therefore, the attenuated coil signal V_coil' and the reference voltage V_ref may be in an identical voltage level.

Figure 4:
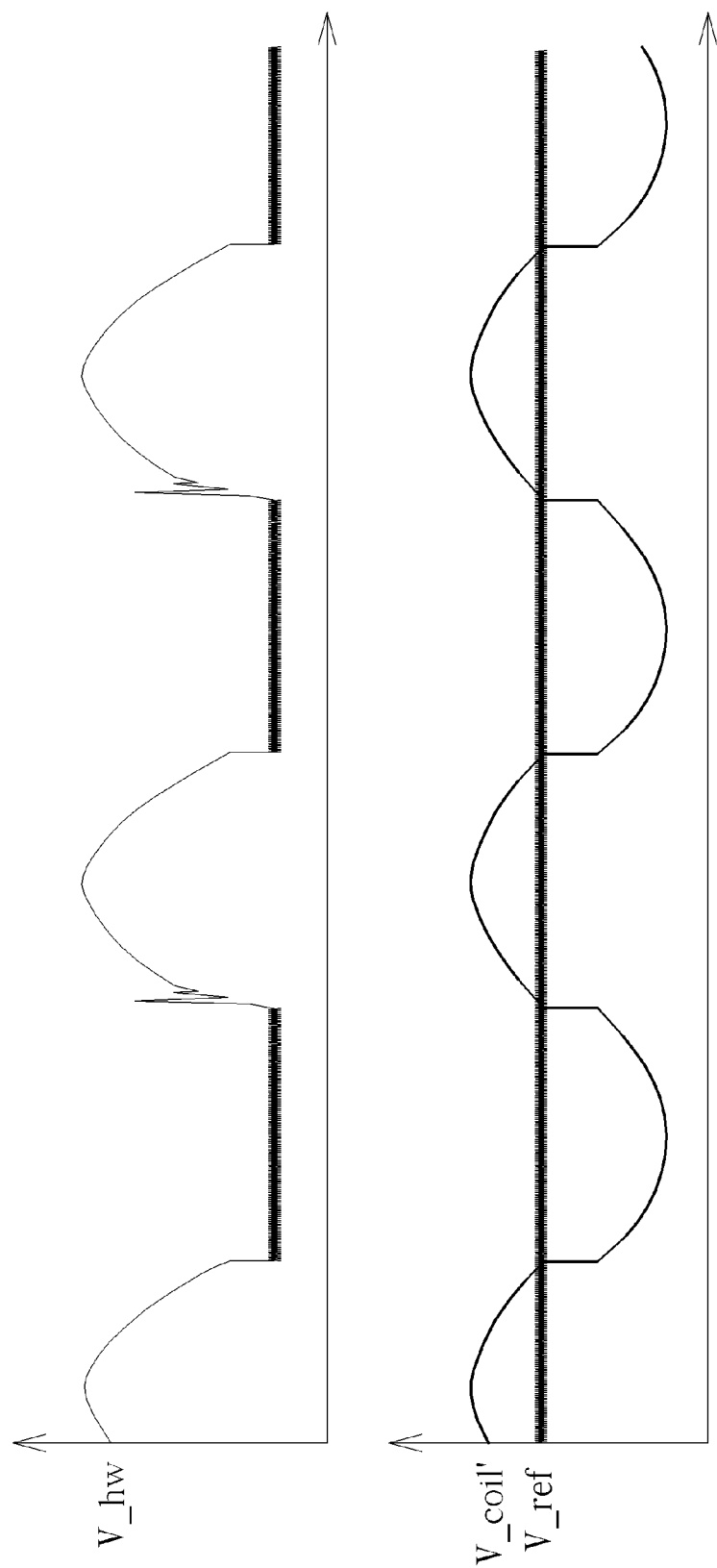
FIG. 4 is a waveform diagram of signals related to the operations of the first amplifier circuit.

Please refer to FIG. 4, which is a waveform diagram of signals related to the operations of the amplifier circuit A1. FIG. 4 illustrates waveforms of the attenuated coil signal V_coil', the reference voltage V_ref and the half-wave signal V_hw. As can be seen in FIG. 4, the level of the reference voltage V_ref is substantially equal to the lowest voltage in the positive half cycles of the attenuated coil signal V_coil'. In such a situation, the half-wave signal V_hw, which is generated by the amplifier circuit A1 retrieving parts of the attenuated coil signal V_coil' higher than the reference voltage V_ref, may include the sine wave in the positive half cycles and exclude the voltage discontinuity generated by switching of the rectangular waves of the driving signals. This prevents the erroneous determination of power adjustment performed by the processor 11 and/or any other ill effects in interpretation of the modulation signal due to voltage discontinuity.

Subsequently, the half-wave signal V_hw may be outputted to the envelope detector circuit E1 and the voltage divider circuit D2, respectively. In order to retrieve tiny variations of the modulation signal, the envelope detector circuit E1 may generate the DC signal V_dc as a reference voltage level according to the waveform of the half-wave signal V_hw. The voltage divider circuit D2 attenuates the half-wave signal V_hw to generate the attenuated half-wave signal V_hw'. The amplifier circuit A2 then receives the attenuated half-wave signal V_hw' and the DC signal V_dc and outputs parts of the attenuated half-wave signal V_hw' higher than the DC signal V_dc (i.e., the peaks of the attenuated half-wave signal V_hw') as the amplified half-wave signal V_hwa.

Figure 5:
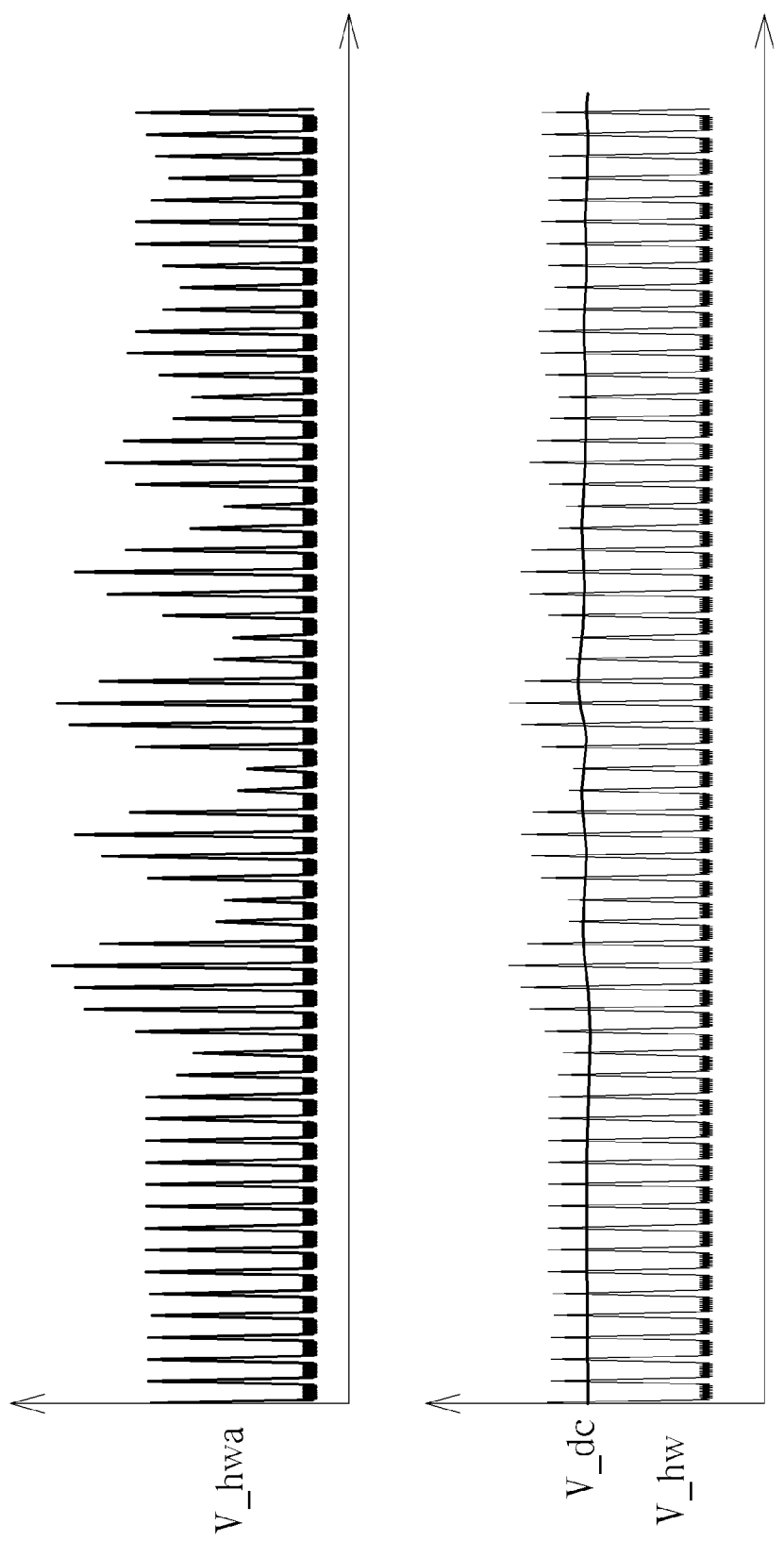
FIG. 5 is a waveform diagram of signals related to the operations of the second amplifier circuit.

Please refer to FIG. 5, which is a waveform diagram of signals related to the operations of the amplifier circuit A2. FIG. 5 illustrates waveforms of the attenuated half-wave signal V_hw', the DC signal V_dc and the amplified half-wave signal V_hwa. As can be seen in FIG. 5, the voltage level of the DC signal V_dc substantially approaches to but does not exceed the peak voltages of the attenuated half-wave signal V_hw'. In such a situation, the amplified half-wave signal V_hw, which is generated by the amplifier circuit A2 retrieving parts of the attenuated half-wave signal V_hw' higher than the DC signal V_dc, may include the peak value variations of the attenuated half-wave signal V_hw'. The amplifier circuit A2 then amplifies the peak value variations. As a result, the waveform of the amplified half-wave signal V_hwa explicitly shows the peak value variations generated by signal modulation, as shown in FIG. 5.

Subsequently, the amplified half-wave signal V_hwa is outputted to the envelope detector circuit E2 for envelope extraction. The envelope detector circuit E2 may filter out the high frequency component of the amplified half-wave signal V_hwa to generate the envelope signal V_env according to peak value variations of the amplified half-wave signal V_hwa. The envelope detector circuit E2 then outputs the envelope signal V_env to the coupling capacitor 2208. The coupling capacitor 2208 may filter out the DC component of the envelope signal V_env and output the AC component of the envelope signal V_env. This AC component is combined with the DC voltage generated by the voltage divider circuit D3, and then outputted to the processor 11, allowing the processor 11 to retrieve the trigger signal V_trig. Please note that the processor 11 needs to interpret the trigger signal V_trig under a stable DC voltage level; hence, the trigger signal V_trig received by the processor 11 should be in a fixed voltage level. However, the coil signal V_coil on the supplying-end coil 171 may undergo significant variations due to load variations in the power receiving device. After the coil signal V_coil is analyzed and processed by the signal analysis circuit 200, the voltage level of the envelope signal V_env may vary due to load variations. In this case, the coupling capacitor 2208 may filter out the DC component of the envelope signal V_env. The AC component of the envelope signal V_env is then incorporated with a fixed DC voltage level generated by the voltage divider circuit D3, to be outputted to the processor 11, so that the processor 11 may accurately interpret the trigger signal V_trig.

Figure 6:
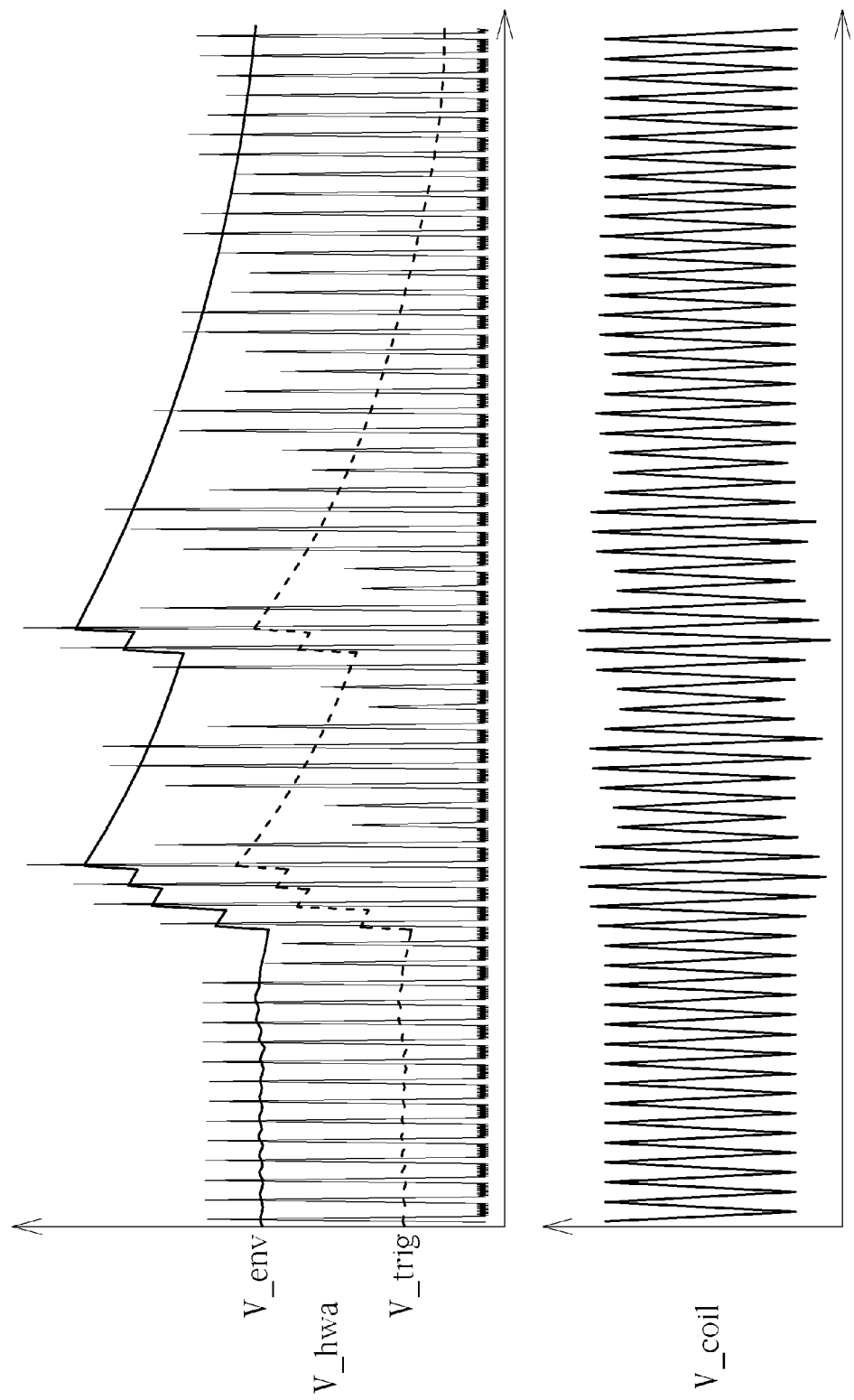
FIG. 6 is a waveform diagram of signals related to the operations of the second envelope detector circuit, the coupling capacitor and the third voltage divider circuit.

Please refer to FIG. 6, which is a waveform diagram of signals related to the operations of the envelope detector circuit E2, the coupling capacitor 2208 and the voltage divider circuit D3. FIG. 6 illustrates waveforms of the amplified half-wave signal V_hwa, the envelope signal V_env, the trigger signal V_trig and the coil signal V_coil. As can be seen in FIG. 6, the envelope signal V_env substantially varies with the peak values of the amplified half-wave signal V_hwa. After the coupling capacitor 2208 filters out the DC component of the envelope signal V_env, the voltage divider circuit D3 provides a fixed DC voltage level, in order to output the trigger signal V_trig to the processor 11. As shown in the waveform of the coil signal V_coil, tiny variations appear on the coil signal V_coil due to signal modulation. After the processing of the signal analysis circuit 200, the trigger signal V_trig having evident variations may be generated, so that the processor 11 may effectively perform signal interpretation.

Figure 7:
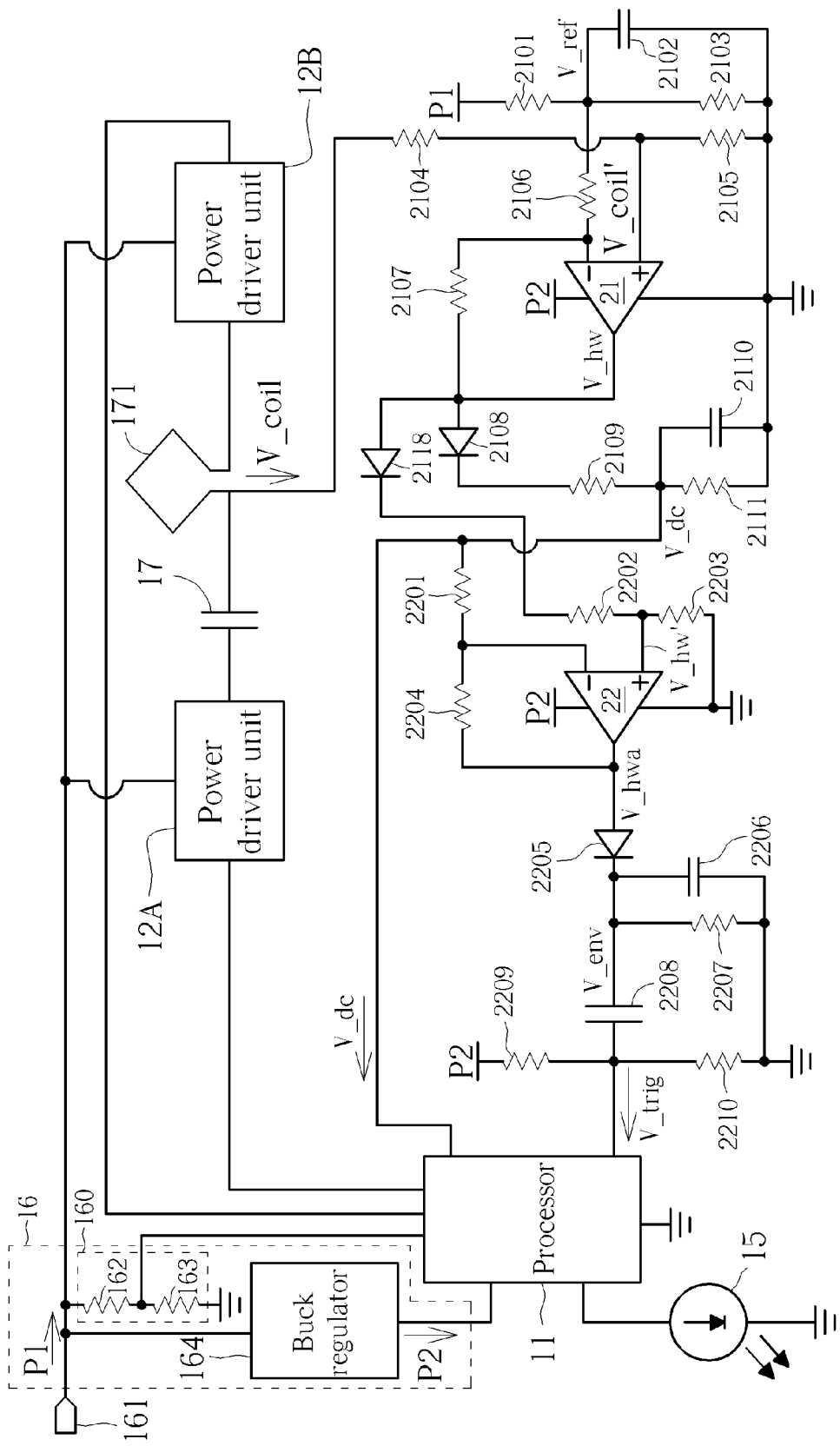
FIG. 7 is a schematic diagram of an implementation of the supplying-end module.

Please refer to FIG. 7, which is a schematic diagram of an implementation of the supplying-end module 20. FIG. 7 further illustrates the detailed circuit structure of the signal analysis circuit 200 in the supplying-end module 20. In the signal analysis circuit 200, the voltage divider circuit D4 is composed of voltage divider resistors 2101 and 2103, which may attenuate the power P1 to generate the reference voltage V_ref and then output the reference voltage V_ref. The voltage divider circuit D1 is composed of voltage divider resistors 2104 and 2105, which may attenuate the coil signal V_coil to generate the attenuated coil signal V_coil' and then output the attenuated coil signal V_coil'. The amplifier circuit A1 includes an operational amplifier 21, an input resistor 2106 and a feedback resistor 2107. The operational amplifier 21 may amplify parts of the attenuated coil signal V_coil' higher than the reference voltage V_ref. The operational amplifier 21 includes a positive input terminal for receiving the attenuated coil signal V_coil', a negative input terminal for receiving the reference voltage V_ref, and an output terminal for outputting the half-wave signal V_hw. The input resistor 2106 is coupled between the negative input terminal of the operational amplifier 21 and the voltage divider circuit D4. The feedback resistor 2107 is coupled between the negative input terminal and the output terminal of the operational amplifier 21. The resistance values of the input resistor 2106 and the feedback resistor 2107 determine the amplification ratio of amplifying parts of the attenuated coil signal V_coil' higher than the reference voltage V_ref. The envelope detector circuit E1 includes an envelope detector diode 2108, a matching resistor 2109, a filter capacitor 2110 and a load resistor 2111. The envelope detector diode 2108 is used for receiving the half-wave signal V_hw. The filter capacitor 2110 is used for filtering out the high frequency component of the half-wave signal V_hw. The load resistor 2111, coupled to the filter capacitor 2110, is used for performing matching with the filter capacitor 2110 for discharging. The matching resistor 2109, coupled between the envelope detector diode 2108, the filter capacitor 2110 and the load resistor 2111, is used for performing resistance matching. In detail, in order to prevent the filter capacitor 2110 in the envelope detector circuit E1 from being charged and discharged overspeed, causing that the DC signal V_dc cannot be outputted stably, the matching resistor 2109 should be disposed between the envelope detector diode 2108, the filter capacitor 2110 and the load resistor 2111. The matching resistor 2109 may also be used for reducing the voltage of the DC signal V_dc outputted by the envelope detector circuit E1, to control the DC signal V_dc to be in a voltage level slightly lower than the peak voltage of the attenuated half-wave signal V_hw'. In addition, the envelope detector circuit E1 is further coupled to the processor 11 and outputs the DC signal V_dc to the processor 11, so that the processor 11 may calculate and measure the voltage of AC signals on the supplying-end coil 171 according to the value of the DC signal V_dc, in order to perform power adjustment.

The voltage divider circuit D2 is composed of voltage divider resistors 2202 and 2203, which may attenuate the half-wave signal V_hw to generate the attenuated half-wave signal V_hw' and then output the attenuated half-wave signal V_hw'. Since the DC signal V_dc is generated from the half-wave signal V_hw by undergoing the forward bias voltage drop of the envelope detector diode 2108 and voltage division of the matching resistor 2109 and the load resistor 2111, the half-wave signal V_hw may also undergo the forward bias voltage drop of a matching diode 2118 and then undergo the voltage division of the voltage divider resistors 2202 and 2203 to generate the attenuated half-wave signal V_hw', so that the DC signal V_dc and the attenuated half-wave signal V_hw' may be in a corresponding voltage level, i.e., the DC signal V_dc is in a voltage level slightly lower than the peak voltage of the attenuated half-wave signal V_hw'. The amplifier circuit A2 includes an operational amplifier 22, an input resistor 2201 and a feedback resistor 2204. The operational amplifier 22 may amplify parts of the attenuated half-wave signal V_hw' higher than the DC signal V_dc. The operational amplifier 22 includes a positive input terminal for receiving the attenuated half-wave signal Vhw', a negative input terminal for receiving the DC signal V_dc, and an output terminal for outputting the amplified half-wave signal V_hwa. The input resistor 2201 is coupled between the negative input terminal of the operational amplifier 22 and the envelope detector circuit E1. The feedback resistor 2204 is coupled between the negative input terminal and the output terminal of the operational amplifier 22. The resistance values of the input resistor 2201 and the feedback resistor 2204 determine the amplification ratio of amplifying parts of the attenuated half-wave signal V_hw' higher than the DC signal V_dc. The envelope detector circuit E2 includes an envelope detector diode 2205, a filter capacitor 2206 and a load resistor 2207. The envelope detector diode 2205 is used for receiving the amplified half-wave signal V_hwa. The filter capacitor 2206, coupled to the envelope detector diode 2205, is used for filtering out the high frequency component of the amplified half-wave signal V_hwa. The load resistor 2207, coupled to the filter capacitor 2206 and the envelope detector diode 2205, is used for performing matching with the filter capacitor 2206 for discharging. Subsequently, the envelope signal V_env outputted by the envelope detector circuit E2 enters the voltage divider circuit D3 after the DC component of the envelope signal V_env is filtered out by the coupling capacitor 2208. The voltage divider circuit D3 may generate a DC voltage that can be processed by the processor 11 via voltage divider resistors 2209 and 2210. This DC voltage may be combined with the AC component of the envelope signal V_env, to generate the trigger signal V_trig to be outputted to the processor 11.

In addition, the power supplying unit 16 of the supplying-end module 20 includes a buck regulator 164 and a voltage detector circuit 160. The buck regulator 164 may receive the power P1 from the external voltage source and decrease the voltage of the power P1 to generate the power P2, and then output the power P2. In detail, the power P1, which is used for driving the operations of the supplying-end coil 171, is always in an extremely high voltage level. The power P2 is mainly used for supplying the operational voltage of the processor 11, and is thereby in a voltage level far lower than the voltage level of the coil and the power P1. In the supplying-end module 20, the power P1 is supplied to the power driver units 12A, 12B and the voltage divider circuit D4. More specifically, the power driver units 12A and 12B drive the supplying-end coil 171 to perform oscillation with the driving voltage coming from the power P1. The voltage divider circuit D4 attenuates the power P1 to generate the reference voltage V_ref, so that the voltage level of the reference voltage V_ref may correspond to the coil voltage V_coil after being attenuated. On the other hand, the power P2 having a lower voltage level is supplied to the processor 11, the amplifier circuits A1, A2 and the voltage divider circuit D3. Therefore, the signal after being processed by the amplifier circuits A1, A2 and the voltage divider circuit D3 may enter the processor 11 under the voltage level tolerable by the processor 11, in order for follow-up decoding and processing. In other words, the operational voltages of the processor 11 and circuit elements such as the amplifier circuits A1, A2 and the voltage divider circuit D3 in the signal analysis circuit 200 are all equal to the voltage level of the power P2. In such a condition, the maximum voltage of the signals after amplifications of the amplifier circuits A1 and A2 should be limited within the voltage level of the power P2. Therefore, both of the trigger signal V_trig and the DC signal V_dc transmitted to the processor 11 may not exceed the maximum tolerable voltage of the processor 11, so that the processor 11 may operate normally and may not be burnt.

Furthermore, the voltage detector circuit 160, coupled to the processor 11, is used for outputting a power signal corresponding to the power P1 to the processor 11, allowing the processor 11 to detect the voltage of the power P1. In the supplying-end module 20, the voltage detector circuit 160 is realized by voltage divider resistors 162 and 163, but should not be limited thereto.

Figure 8:
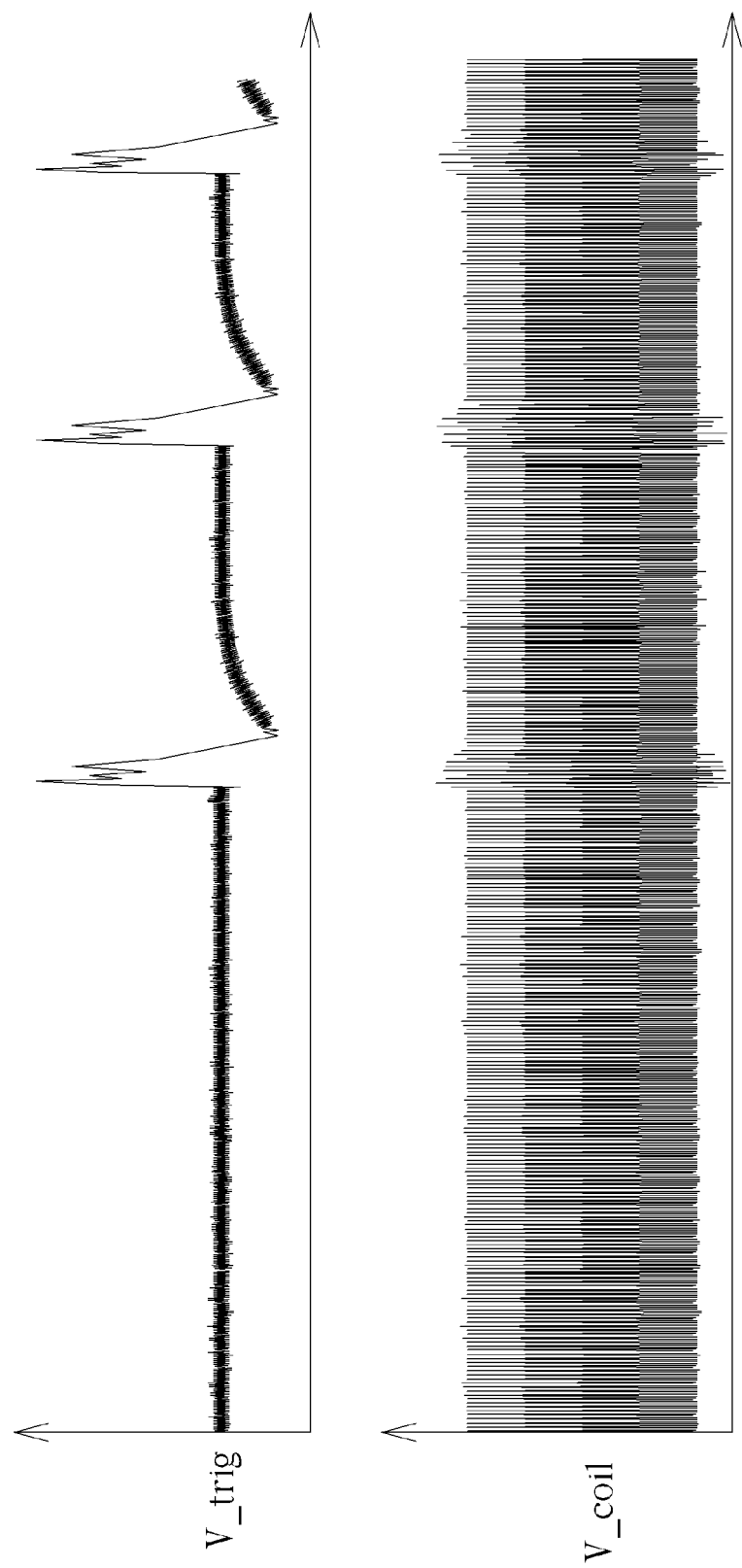
FIG. 8 is a waveform diagram of multiple successive trigger signals.

The present invention can retrieve tiny amplitude variations on the supplying-end coil 171 to generate the trigger signal V_trig via the abovementioned circuit structures of the signal analysis circuit 200 and the related operational methods. The processor 11 then decodes the trigger signal V_trig to obtain data codes. As shown in FIG. 6, the signal analysis circuit 200 may convert the tiny variations on the coil signal V_coil into the trigger signal V_trig, which can be interpreted by the processor 11. FIG. 8 further illustrates the waveform of multiple successive trigger signals. As shown in FIG. 8, every tiny variation on the peak value of the coil signal V_coil may generate an evident variation of the trigger signal V_trig.

In the present invention, the voltage divider circuits in the input terminal of the signal analysis circuit directly and significantly attenuate the signals from the coil; hence, the back-end circuits can be implemented with circuit elements having a lower withstanding voltage. This significantly reduces the costs of circuit and the areas of circuit elements. In addition, the signal analysis circuit of the present invention directly analyzes and processes the AC signals; this is different from the conventional signal analysis circuit which processes the signals after performing low-pass filtering on the coil signals. In other words, the signal analysis circuit of the present invention does not include any low-pass filters and therefore performs processing on original signals. Thus, the signals having smaller variations may not be wrongly filtered out by the low-pass filter.

More specifically, the signal analysis circuit of the present invention applies two amplifiers to realize amplifications of signals, wherein the first-stage amplification may eliminate the voltage discontinuity generated by switching of the rectangular wave driving signals, and the second-stage amplification is used for retrieving tiny variations on the coil signal. In contrast to the conventional signal analysis circuit where a low-pass filter always requires a large number of circuit elements (e.g., an active low-pass filter may have more than ten amplifiers), the present invention may retrieve the trigger signal by using fewer circuit elements. In addition, in the present invention, the parameters of the circuit elements may be configured in a predefined ratio to allow the signal analysis circuit to operate normally in different driving voltages. The amplification ratio for signal variations in the second-stage amplification may be adjusted by varying the resistance values in the amplifier circuit. The sensitivity of signal analysis can thereby be adjusted easily, in order to be complied with requirements of product specifications.

To sum up, the signal analysis circuit of the present invention may be used in the supplying-end module of the induction type power supply system. The signal analysis circuit may realize two-stage amplification of signals via two amplifiers and also eliminate the voltage discontinuity on the coil signal generated by switching of the rectangular wave of the driving signals, in order to prevent the voltage discontinuity from interfering the determination of power adjustment and/or the interpretation of modulation signals. The signal analysis circuit of the present invention may retrieve tiny amplitude variations on the coil signal to obtain the trigger signal. The circuit structure of the signal analysis circuit can be operated in a lower voltage, which achieves the benefits such as lower costs and smaller areas, and also realizes satisfactory performance of signal analysis.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A signal analysis circuit for a supplying-end module of an induction type power supply system for analyzing a coil signal on a supplying-end coil of the supplying-end module to retrieve a trigger signal, the signal analysis circuit comprising:
    a first voltage divider circuit, coupled to the supplying-end coil, for attenuating the coil signal to generate an attenuated coil signal;
    a first amplifier circuit, coupled to the first voltage divider circuit, for obtaining parts of the attenuated coil signal higher than a reference voltage to output a half-wave signal;
    a first envelope detector circuit, coupled to the first amplifier circuit, for performing envelope extraction on the half-wave signal to obtain a direct current (DC) signal and outputting the DC signal;
    a second voltage divider circuit, coupled to the first amplifier circuit, for attenuating the half-wave signal to generate an attenuated half-wave signal;
    a second amplifier circuit, coupled to the first envelope detector circuit and the second voltage divider circuit, for obtaining parts of the attenuated half-wave signal higher than the DC signal to output an amplified half-wave signal;
    a second envelope detector circuit, coupled to the second amplifier circuit, for performing envelope extraction on the amplified half-wave signal to generate an envelope signal and outputting the envelope signal;
    a coupling capacitor, coupled to the second envelope detector circuit, for performing filtering on the envelope signal to filter out a DC component of the envelope signal and outputting an alternating current (AC) component of the envelope signal; and
    a third voltage divider circuit, coupled to the coupling capacitor, for generating a DC voltage which is combined with the AC component of the envelope signal to output the trigger signal.

2. The signal analysis circuit of claim 1, further comprising:
    a fourth voltage divider circuit, coupled to the first amplifier circuit, for generating the reference voltage and outputting the reference voltage to the first amplifier circuit; and
    a voltage regulator capacitor, coupled to the fourth voltage divider circuit, for stabilizing the reference voltage.

3. The signal analysis circuit of claim 2, wherein a voltage attenuation ratio of the fourth voltage divider circuit attenuating its input voltage to generate the reference voltage is equal to a ratio of the first voltage divider circuit attenuating the coil signal.

4. The signal analysis circuit of claim 1, wherein the supplying-end module further comprises:
    a resonant capacitor, coupled to the supplying-end coil, for performing resonance together with the supplying-end coil;
    at least one power driver unit, coupled to the supplying-end coil and the resonant capacitor, for driving the supplying-end coil to generate power;
    an external voltage source, for outputting a first power;
    a power supplying unit, coupled to the external voltage source, for receiving the first power to generate a second power; and
    a processor, coupled to the signal analysis circuit, for receiving the trigger signal and decoding the trigger signal to obtain a modulation data.

5. The signal analysis circuit of claim 4, wherein the first power is supplied to the at least one power driver unit and a fourth voltage divider circuit generating the reference voltage in the signal analysis circuit.

6. The signal analysis circuit of claim 4, wherein the second power is supplied to the processor, the first amplifier circuit, the second amplifier circuit and the third voltage divider circuit.

7. The signal analysis circuit of claim 4, wherein the power supplying unit comprises:
    a buck regulator, for decreasing a voltage of the first power to generate the second power and outputting the second power; and
    a voltage detector circuit, coupled to the processor, for outputting a power signal corresponding to the first power to the processor, allowing the processor to detect the voltage of the first power.

8. The signal analysis circuit of claim 4, wherein the processor further receives the DC signal outputted by the first envelope detector circuit to perform power adjustment.

9. The signal analysis circuit of claim 1, wherein the reference voltage is substantially equal to a lowest voltage in positive half cycles of the attenuated coil signal.

10. The signal analysis circuit of claim 1, wherein the first voltage divider circuit comprises:
    at least one voltage divider resistor, for attenuating the coil signal and outputting the attenuated coil signal.

11. The signal analysis circuit of claim 1, wherein the first amplifier circuit comprises:
    an operational amplifier, for amplifying the parts of the attenuated coil signal higher than the reference voltage, the operational amplifier comprising:
        a first input terminal, for receiving the attenuated coil signal;
        a second input terminal, for receiving the reference voltage; and
        an output terminal, for outputting the half-wave signal;
    an input resistor, coupled to the second input terminal of the operational amplifier; and a feedback resistor, coupled between the second input terminal and the output terminal of the operational amplifier;

wherein resistance values of the input resistor and the feedback resistor determine an amplification ratio of amplifying the parts of the attenuated coil signal higher than the reference voltage.

12. The signal analysis circuit of claim 1, wherein the first envelope detector circuit comprises:
an envelope detector diode, for receiving the half-wave signal;
a filter capacitor, for filtering out a high frequency component of the half-wave signal;
a load resistor, coupled to the filter capacitor, for performing matching with the filter capacitor for discharging; and
a matching resistor, coupled between the envelope detector diode, the filter capacitor and the load resistor, for performing resistance matching.

13. The signal analysis circuit of claim 1, wherein the second voltage divider circuit comprises:
at least one voltage divider resistor, for attenuating the half-wave signal and outputting the attenuated half-wave signal.

14. The signal analysis circuit of claim 1, wherein the second amplifier circuit comprises:
an operational amplifier, for amplifying the parts of the attenuated half-wave signal higher than the DC signal, the operational amplifier comprising:
a first input terminal, for receiving the attenuated half-wave signal;
a second input terminal, for receiving the DC signal; and
an output terminal, for outputting the amplified half-wave signal;
an input resistor, coupled to the second input terminal of the operational amplifier; and
a feedback resistor, coupled between the second input terminal and the output terminal of the operational amplifier;
wherein resistance values of the input resistor and the feedback resistor determine an amplification ratio of amplifying the parts of the attenuated half-wave signal higher than the DC signal.

15. The signal analysis circuit of claim 1, wherein the second envelope detector circuit comprises:
an envelope detector diode, for receiving the amplified half-wave signal;
a filter capacitor, coupled to the envelope detector diode, for filtering out a high frequency component of the amplified half-wave signal; and
a load resistor, coupled to the filter capacitor and the envelope detector diode, for performing matching with the filter capacitor for discharging.

16. The signal analysis circuit of claim 1, wherein the third voltage divider circuit comprises:
at least one voltage divider resistor, for generating the DC voltage and outputting the trigger signal.

17. A supplying-end module for an induction type power supply system, comprising:
a supplying-end coil;
a resonant capacitor, coupled to the supplying-end coil, for performing resonance together with the supplying-end coil;
at least one power driver unit, coupled to the supplying-end coil and the resonant capacitor, for driving the supplying-end coil to generate power;
an external voltage source, for outputting a first power;
a power supplying unit, coupled to the external voltage source, for receiving the first power to generate a second power;
a signal analysis circuit, coupled to the supplying-end coil, for analyzing a coil signal on the supplying-end coil to retrieve a trigger signal, the signal analysis circuit comprising:
a first voltage divider circuit, coupled to the supplying-end coil, for attenuating the coil signal on the supplying-end coil to generate an attenuated coil signal;
a first amplifier circuit, coupled to the first voltage divider circuit, for obtaining parts of the attenuated coil signal higher than a reference voltage to output a half-wave signal;
a first envelope detector circuit, coupled to the first amplifier circuit, for performing envelope extraction on the half-wave signal to obtain a direct current (DC) signal and outputting the DC signal;
a second voltage divider circuit, coupled to the first amplifier circuit, for attenuating the half-wave signal to generate an attenuated half-wave signal;
a second amplifier circuit, coupled to the first envelope detector circuit and the second voltage divider circuit, for obtaining parts of the attenuated half-wave signal higher than the DC signal to output an amplified half-wave signal;
a second envelope detector circuit, coupled to the second amplifier circuit, for performing envelope extraction on the amplified half-wave signal to generate an envelope signal and outputting the envelope signal;
a coupling capacitor, coupled to the second envelope detector circuit, for performing filtering on the envelope signal to filter out a DC component of the envelope signal and outputting an alternating circuit (AC) component of the envelope signal; and
a third voltage divider circuit, coupled to the coupling capacitor, for generating a DC voltage which is combined with the AC component of the envelope signal to output the trigger signal; and
a processor, coupled to the signal analysis circuit, for receiving the trigger signal and decoding the trigger signal to obtain a modulation data.

18. The supplying-end module of claim 17, wherein the signal analysis circuit further comprises:
a fourth voltage divider circuit, coupled to the first amplifier circuit, for generating the reference voltage and outputting the reference voltage to the first amplifier circuit; and
a voltage regulator capacitor, coupled to the fourth voltage divider circuit, for stabilizing the reference voltage.

19. The supplying-end module of claim 18, wherein a voltage attenuation ratio of the fourth voltage divider circuit attenuating its input voltage to generate the reference voltage is equal to a ratio of the first voltage divider circuit attenuating the coil signal.

20. The supplying-end module of claim 19, wherein the first power is supplied to the at least one power driver unit and the fourth voltage divider circuit.

21. The supplying-end module of claim 17, wherein the second power is supplied to the processor, the first amplifier circuit, the second amplifier circuit and the third voltage divider circuit.

22. The supplying-end module of claim 17, wherein the power supplying unit comprises:

a buck regulator, for decreasing a voltage of the first power to generate the second power and outputting the second power; and a voltage detector circuit, coupled to the processor, for outputting a power signal corresponding to the first power to the processor, allowing the processor to detect the voltage of the first power.

23. The supplying-end module of claim 17, wherein the processor further receives the DC signal outputted by the first envelope detector circuit to perform power adjustment.

24. The supplying-end module of claim 17, wherein the reference voltage is substantially equal to a lowest voltage in positive half cycles of the attenuated coil signal.

25. The supplying-end module of claim 17, wherein the first voltage divider circuit comprises:
at least one voltage divider resistor, for attenuating the coil signal and outputting the attenuated coil signal.

26. The supplying-end module of claim 17, wherein the first amplifier circuit comprises:
an operational amplifier, for amplifying the parts of the attenuated coil signal higher than the reference voltage, the operational amplifier comprising:
a first input terminal, for receiving the attenuated coil signal;
a second input terminal, for receiving the reference voltage; and
an output terminal, for outputting the half-wave signal;
an input resistor, coupled to the second input terminal of the operational amplifier; and
a feedback resistor, coupled between the second input terminal and the output terminal of the operational amplifier;
wherein resistance values of the input resistor and the feedback resistor determine an amplification ratio of amplifying the parts of the attenuated coil signal higher than the reference voltage.

27. The supplying-end module of claim 17, wherein the first envelope detector circuit comprises:
an envelope detector diode, for receiving the half-wave signal;
a filter capacitor, for filtering out a high frequency component of the half-wave signal;
a load resistor, coupled to the filter capacitor, for performing matching with the filter capacitor for discharging; and
a matching resistor, coupled between the envelope detector diode, the filter capacitor and the load resistor, for performing resistance matching.

28. The supplying-end module of claim 17, wherein the second voltage divider circuit comprises:
at least one voltage divider resistor, for attenuating the half-wave signal and outputting the attenuated half-wave signal.

29. The supplying-end module of claim 17, wherein the second amplifier circuit comprises:
an operational amplifier, for amplifying the parts of the attenuated half-wave signal higher than the DC signal, the operational amplifier comprising:
a first input terminal, for receiving the attenuated half-wave signal;
a second input terminal, for receiving the DC signal; and
an output terminal, for outputting the amplified half-wave signal;
an input resistor, coupled to the second input terminal of the operational amplifier; and
a feedback resistor, coupled between the second input terminal and the output terminal of the operational amplifier;
wherein resistance values of the input resistor and the feedback resistor determine an amplification ratio of amplifying the parts of the attenuated half-wave signal higher than the DC signal.

30. The supplying-end module of claim 17, wherein the second envelope detector circuit comprises:
an envelope detector diode, for receiving the amplified half-wave signal;
a filter capacitor, coupled to the envelope detector diode, for filtering out a high frequency component of the amplified half-wave signal; and
a load resistor, coupled to the filter capacitor and the envelope detector diode, for performing matching with the filter capacitor for discharging.

31. The supplying-end module of claim 17, wherein the third voltage divider circuit comprises:
at least one voltage divider resistor, for generating the DC voltage and outputting the trigger signal.

* * * * *